United States Patent [11] 3,601,668

[72] Inventors Gary G. Slaten
Palo Alto;
Edward H. Snow, Los Altos, both of, Calif.

[21] Appl. No. 874,745
[22] Filed Nov. 7, 1969
[45] Patented Aug. 24, 1971
[73] Assignee Fairchild Camera and Instrument Corporation
Mt. View, Calif.

[54] SURFACE DEPLETION LAYER PHOTODEVICE
5 Claims, 4 Drawing Figs.

[52] U.S. Cl. .......... 317/234 R, 317/235 N, 317/235 AG, 317/235 AM, 317/235 B, 250/211
[51] Int. Cl. .......... H01l 15/00
[50] Field of Search .......... 317/235; 250/211 J, 83

[56] References Cited
UNITED STATES PATENTS

| | | | |
|---|---|---|---|
| 3,523,190 | 8/1970 | Goetzberger et al. | 250/211 |
| 3,391,282 | 7/1968 | Kabell | 250/211 |
| 3,463,974 | 8/1969 | Kelley | 317/235 |
| 3,405,329 | 10/1968 | Loro | 317/234 |
| 3,459,944 | 8/1969 | Triebwasser | 250/211 |

*Primary Examiner*—John W. Huckert
*Assistant Examiner*—Martin H. Edlow
*Attorneys*—Roger S. Borovoy and Alan H. MacPherson ABSTRACT: A semiconductor photodevice sensitive to blue light is produced by placing an oxide layer containing a selected surface state charge density over one surface of the device. The fixed surface state charge density creates a surface depletion region in the semiconductor material immediately underlying the oxide. Blue light incident on the device, which is normally absorbed before reaching the depletion region associated with a PN junction strikes the surface depletion layer and produces photocurrent therein.

INVENTORS
GARY G. SLATEN
EDWARD H. SNOW
BY Alan H. MacPherson
ATTORNEY

PATENTED AUG 24 1971 3,601,668

INVENTORS
GARY G. SLATEN
EDWARD H. SNOW
BY Alan H. MacPherson
ATTORNEY

SURFACE DEPLETION LAYER PHOTODEVICE

BACKGROUND OF THE INVENTION

1. Field of the Invention

This invention relates to photodevices and in particular to photodevices containing a depletion layer close to the surface thereby to achieve maximum collection efficiency in the device.

2. Description of the Prior Art

Semiconductor photodevices are made by diffusing a region of a first conductivity type into a semiconductor material of a second conductivity type. Application of a reverse bias across the resulting PN junction widens the junction depletion layer. Light which then strikes the semiconductor material generates hole-electron pairs in the depletion layer. These holes and electrons are accelerated by the bias field in opposite directions thereby creating photocurrent. One problem with prior art photodevices is that the PN junction, and thus the depletion layer, is formed at least several microns within the semiconductor material. The semiconductor material however, absorbs blue light within about 1 micron of the surface. Therefore, the light intensity which reaches the depletion layer has been substantially reduced relative to the light intensity which strikes the surface of the semiconductor device. This lowers the collection efficiency of the photodevice.

SUMMARY OF THE INVENTION

This invention overcomes this problem of prior art photodevices by providing a photodevice with a surface depletion layer. Consequently, the light reaching the depletion layer contains a substantial amount of blue light and the collection efficiency of the photodevice is substantially improved relative to the collection efficiency of prior art devices.

According to this invention, a surface depletion layer is produced in a photodevice by first forming a diffused contact region of one conductivity type in a second conductivity-type semiconductor substrate. The remainder of the device surface is oxidized, and the wafer, with the resulting oxide layer, is processed so as to produce a fixed surface state charge density $Q_{ss}/q$ of about $5\times10^{11}$ per centimeter$^2$ or greater. The resulting surface state charge density depletes that portion of the semiconductor substrate immediately underlying the oxide layer, and, in some situations, may even invert this portion from one conductivity type to the second conductivity type. This surface depletion layer, which extends to, and is continuous with the depletion layer of the diffused region, then is reverse biased by applying a voltage to the diffused contact region.

The properties of surface depletion layers are discussed in detail in chapters 9 and 10 of A.S. Grove's book entitled "Physics and Technology of Semiconductor Devices" published in 1967 by John Wiley and Sons, Inc.

The invented device is made reliable by using a channel stop diffusion and/or an equipotential field relief electrode.

To achieve maximum collection efficiency, the surface recombination velocity at the depleted silicon surface is minimized. This is done by one of several process techniques.

Photodiodes and phototransistors produced according to this invention have maximum collection efficiency in the surface depletion layer and thus better performance than prior art devices.

DETAILED DESCRIPTION

Figure 1:
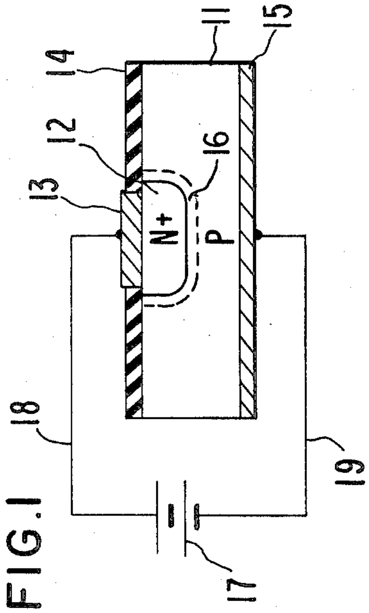
FIG. 1 shows a typical photodevice of the prior art.

FIG. 1 shows a typical photodiode of the prior art. A substrate 11 of one conductivity type, shown in FIG. 1 as P-type conductivity, has diffused in one overlying thereof a region 12 of opposite (N) type conductivity. Overlying the PN junction between regions 11 and 12 is a silicon oxide layer 14. This oxide layer both passivates the edge of the PN junction between regions 12 and 11 and serves as a mask during diffusion of region 12. Metal contact layer 13 is deposited over the top surface of region 12 to gallium ohmic contact thereto. Metal contact 15 on the bottom side of P-type region 11 provides ohmic contact to P-type region 11. Battery 17 connected to contacts 12 and 15 by leads 18 and 19 respectively, reverse biases the PN junction between regions 11 and 12.

Because of the reverse bias across the PN junction, its inherent depletion layer 16 widens into the P-type region 11. In this depletion layer, holes have been repelled from the depletion region by the positive polarity of N+ region 12. Incident light which strikes the depletion region then generates electron-hole pairs. The electrons generated are attracted to metal contact 13 by the positive potential of this contact. The holes generated by the incident light in depletion region 16 are attracted to metal contact 15, held at a negative potential by battery 17. Because the main portion of PN junction between regions 11 and 12 is in the body of semiconductor material more than 1 micron beneath the top surface of semiconductor material 11, blue light in the energy incident on the diode is filtered out by the semiconductor material. Thus the total amount of light energy striking the main portion of depletion region 16 is significantly reduced relative to the total incident light energy.

Figure 2:
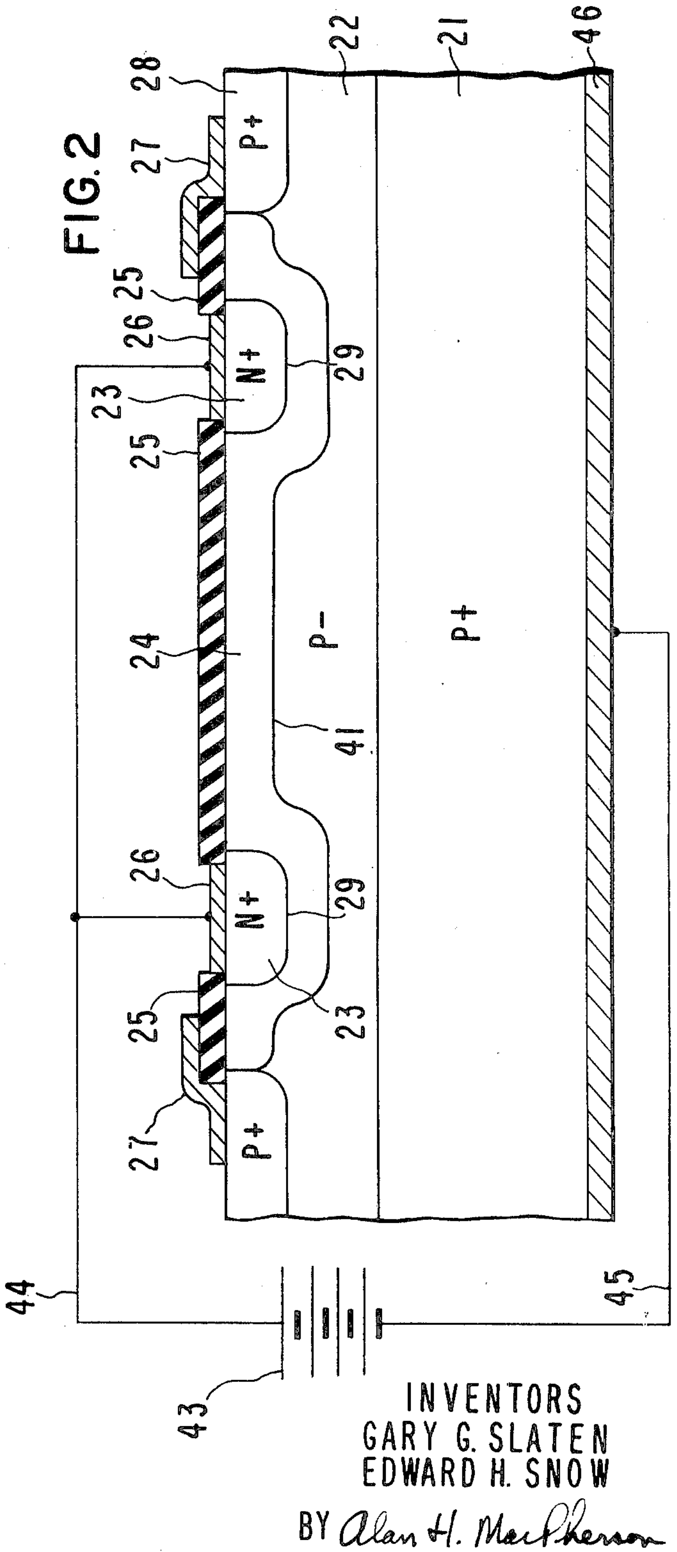
FIG. 2 shows a photodiode constructed according to the principles of this invention.

The semiconductor diode shown in FIG. 2 is constructed according to the principles of this invention to use substantially all the light incident upon the semiconductor material to generate hole-electron pairs in the depletion region. Shown in FIG. 2 is a P+ substrate 21, typically silicon, on which is grown a $P^1$ epitaxial layer 22. Epitaxial layer 22 may be grown on substrate 21, for example, by placing substrate 21 in a epitaxial reactor and then flowing silane and a carrier gas past the substrate. The decomposition of silane results in the growth of an epitaxial layer on substrate 21. This technique, and others, are well known and will not be described in further detail. A typical thickness for epitaxial layer 22 is several microns. The device may also be made on a nonepitaxial $P^1$ wafer.

Next, a silicon oxide layer 25 is formed on the top surface of epitaxial layer 22. Oxide layer 25 is formed by oxidizing the top surface of layer 22 by any of several well-known techniques. A typical thickness for oxide layer 25 is 0.1 to 1 microns. Other dielectrics such as silicon nitride, $SI_3N_4$, may be used in addition to, or in place of, the oxide layer.

Next, windows are cut in oxide layer 25 and N-type impurities are diffused through these windows to form N+ regions 23 within epitaxial layer 22. N-type regions 23 are formed by diffusing an N-type impurity, such as phosphorus, through the windows in oxide layer 25 into layer 22.

Oxide layer 25 contains several types of electrical charges. In particular, impurity ions $Q_0$, chargeable surface states or surface recombination-generation centers $N_{st}$ and fixed surface state charges $Q_{ss}$ are commonly present in oxide layer 25 or at the interface between layer 25 and P-type epitaxial layer 22. The impurity ions $Q_0$ can be eliminated by careful processing or immobilized within layer 25 through phosphorus gettering techniques or by adding phosphorus pentoxide to oxide layer 25.

The fixed surface state charges $Q_{ss}$, on the other hand, while commonly thought of as undesirable, are turned to advantage by this invention and rather than degrading the performance of the resulting device, are used to make possible the surface depletion layer of this device. As disclosed in patent application Ser. No. 531,069 entitled "Oxygen Annealing" filed by Bruce Deal on Mar. 2, 1966 and assigned to Fairchild Camera and Instrument Corporation, the assignee of this application, the value of surface state charges $Q_{ss}$ in an oxide layer can be controlled by dry oxygen annealing of the oxide layer in the underlying substrate. By controlling the time and temperature of the annealing, the value of the fixed surface charge $Q_{ss}$ is accurately controlled. Alternatively, the cooling rate of the device after the annealing can be used to further control the surface state charge.

Thus, the device shown in FIG. 2, with the overlying oxide layer 2is next placed in a dry oxygen ambient for a time sufficient to provide the desired surface charge density $Q_{ss}/q$, where $q$ is the charge on a electron. The relationship between the times and temperatures of this heating are shown in detail in the above referenced patent application and the description of this process in that patent application is incorporated herein by reference. It is disclosed in that application that the surface charge density given by heating in a dry oxygen ambient for a given time and a given temperature depends upon the conductivity type of the underlying substrate. But in essence, the surface state charge density $Q_{ss}/q$ can be varied over a range of values of from 2 to $12\times10^{11}$ per $cm^2$. According to this invention, a surface charge density $Q_{ss}/q$ of about $5\times10^{11}$ per $cm^2$. is obtained by heating the structure in a dry oxygen ambient to a temperature of about 1000° for about 10 minutes. This surface state charge accumulates at the interface between oxide layer 25 and underlying epitaxial layer 22. Because this fixed surface state charge is positive, holes are repelled from the top region of epitaxial layer 22 by the positive charge at the top surface of layer 22. Accordingly, a region next to the top surface of layer 22 is essentially depleted of holes to form the surface depletion layer 24. Depending on the surface charge density and the doping of the underlying material, depletion layer 24 may or may not be inverted.

After a light etch to remove selected portions of the oxide which may have formed on the windows through oxide 25 during the N-type impurity diffusion, metal layers 26 are placed in these windows to contact diffused regions 23. Lead 44 extends from metal contacts 26 to the positive terminal of a power supply 43, while lead 45 extends from a metal contact 46 on the bottom surface of P+ substrate 21 to power supply 43. Thus the surface depletion region 24 in the top portion of layer 22 is back biased. Depletion region 24 extends around and is continuous with the depletion regions induced between the N+ regions 23 and the $P^1$ region 22. The surface depletion region 24 is terminated by use of a P+ guard ring 28 which encircles the region formed by the photodiode. Metal contacts 27 are attached to the top surface of P+ guard ring 28 and extend over the insulation 25 toward the center of the device.

Figure 4:
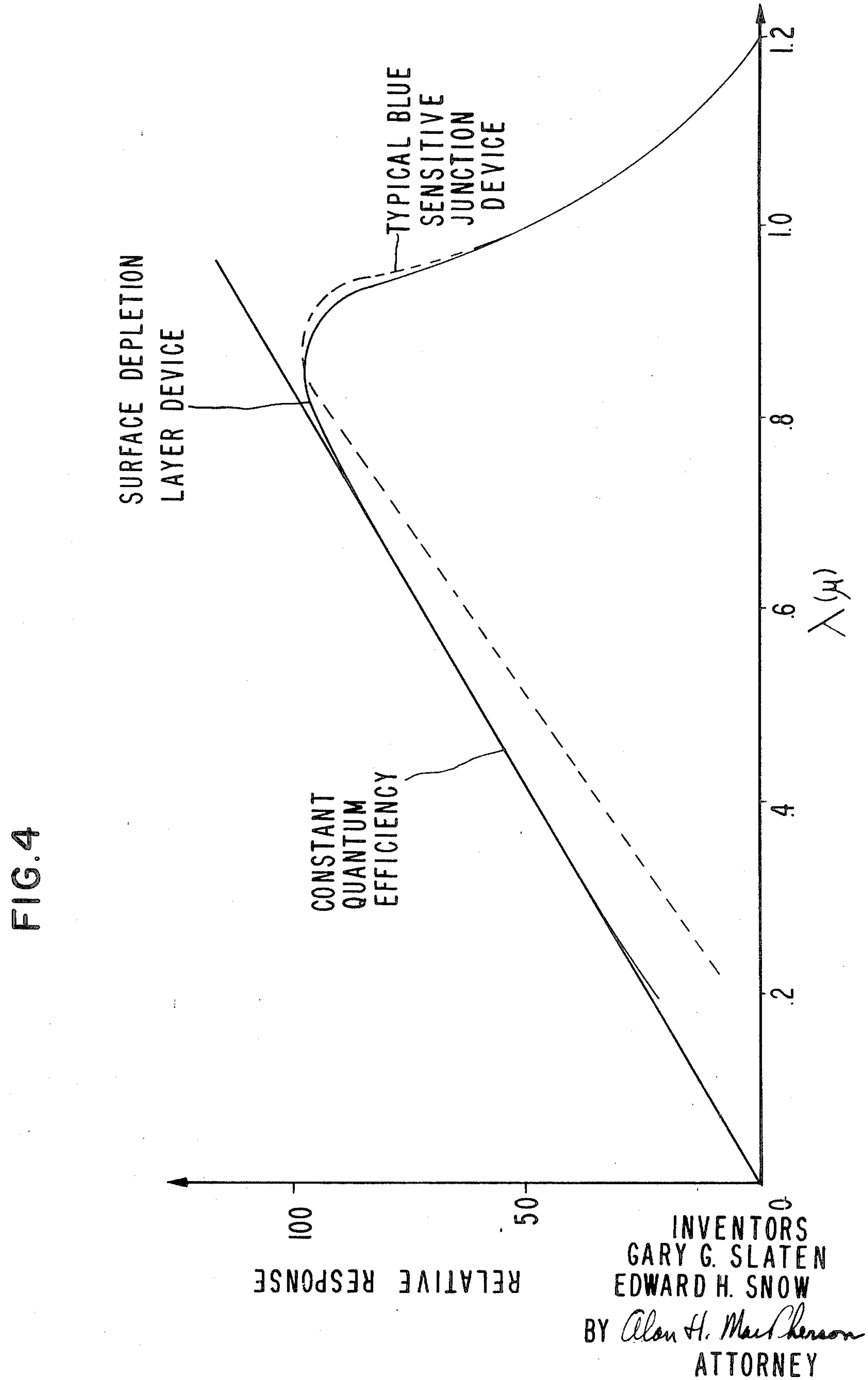
FIG. 4 shows the performance of a photodevice constructed according to the principles of this invention compared to the performance of a typical blue-sensitive junction device.

A comparison in FIG. 4 of the photoresponse of the diode shown in FIG. 2 with the photoresponse of a blue-sensitive junction device shows that the surface depletion layer diode achieves essentially the same performance as a blue-sensitive junction diode at long wavelengths and improved performance at the short wavelength (blue) end of the spectrum.

The final operation is to minimize the surface recombination velocity $N_{st}$ at the depleted silicon surface. This can be achieved by heating the diode to 300–565° C. with aluminum covering the oxidized surface, or by hydrogen annealing in the same temperature range, or by choosing a (100) oriented surface, or by a combination of these techniques. These techniques are all well known in the semiconductor arts.

The technique of this invention can also be used to produce a surface depletion phototransistor. To obtain a phototransistor from the structure shown in FIG. 2, a P-type emitter region is diffused into a selected portion of N+ region 23. An emitter contact is then made to the emitter region, An the PN junction between the emitter region and N+ region is covered by an oxide layer.

Figure 3:
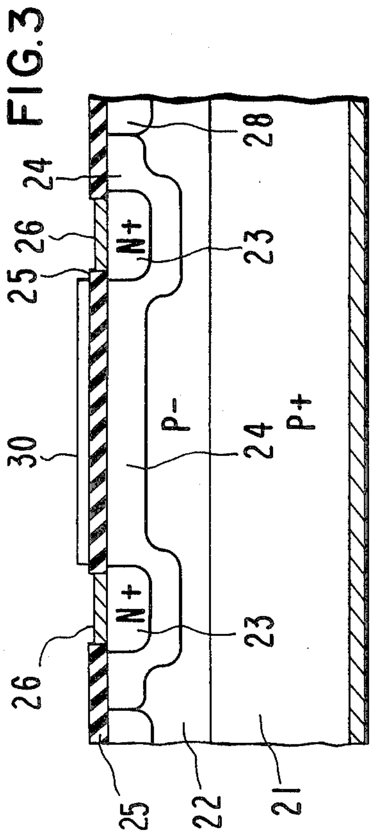
FIG. 3 shows a photodevice wherein the surface depletion layer is obtained by biasing a transparent gate electrode.

FIG. 3 shows an embodiment of this invention where the inversion layer 24 is produced not by a surface state charge $Q_{ss}$, but rather by a bias voltage applied to a transparent gate electrode 30. In FIG. 3 the elements of the photodevice identical to the elements of the photodevice shown in FIG. 2 are identically numbered. The essential difference between the structure of FIG. 3 and the structure of FIG. 2 is that in FIG. 3 a transparent gate electrode is deposited over the center portion of oxide layer 25 between the two regions 23. Gate electrode 30 might for example be constructed of tin oxide, a well-known transparent, conductive material, Application of a voltage to gate electrode 30 produces depletion layer 24 in the top portion of epitaxial layer 22. Light incident on the device travels through transparent gate 30 and generates photocurrent in the form of hole-electron pairs in depletion layer 24.

Depletion layer 24 may or may not be inverted depending upon the voltage applied to gate electrode 30, the doping of epitaxial layer 22, and the residual surface charge density of oxide layer 25. In addition, depletion layer 24 can, of course, be generated by a combination of a surface state charge $Q_{ss}$ at the interface of oxide layer 25 with epitaxial layer 22 and a voltage applied to transparent gate 30.

While the structure of this invention has been described with silicon dioxide as the insulation layer 25 (FIGS. 2 and 3), as mentioned above, silicon nitride ($Si_3N_4$) can also be used as the dielectric layer. Other dielectrics which exhibit a fixed surface state charge can also be used in this invention. Such dielectrics might include, for example, aluminum oxide ($AlO_2$). The typical surface charge density obtained with a silicon nitride film is described in an article by Deal, Fleming, and Castro, entitled "Electrical Properties of Vapor Deposited Silicon Nitride and Silicon Oxide Films on Silicon," published in the Journal of the Electrochemical Society on pages 300 to 307 in Volume 115, No. 3, Mar. 1968. As stated on page 302 of this article, a surface charge density $Q_s'/q$ greater than $10^{12}$ per $cm.^2$ was obtained from a silicon nitride film that had been annealed at 550° C. for 2 minutes in dry nitrogen. This charge is higher than the corresponding charges associated with either a vapor deposited oxide or a thermally grown oxide. The surface charge $Q_s'/q$ measured by Deal, Fleming and Castro is not believed to be the same as $Q_{ss}$, the fixed surface state charge associated with thermally oxidized silicon. While Deal, Fleming and Castro report that the data indicate that the charges represented by $Q_s'/q$ are associated with the dielectric-silicon interface, further information on these charges is needed before the sources of these charges can be positively determined. Regardless, these charges can be used to advantage in the structure of this invention.

Other embodiments of this invention are also possible. For example, a semiconductor material which has a high surface charge density $Q_{ss}/q$ without an overlying oxide can be used for the semiconductor material comprising layers 21 and 22. Gallium arsenide is one material which has these characteristics. The surface charge $Q_{ss}$ on the surface of the gallium arsenide creates the surface depletion layer 24 in which photo currents are then generated. If desired, a transparent protective coating could be placed over the surface of the gallium arsenide to protect this surface.

In another embodiment of this invention, Schottky barriers can be placed over those portions of epitaxial layer 22 exposed by the windows in oxide layer 25 (FIG. 2). The Schottky barriers would function in place of the N+ regions 23 as a rectifying barrier and electrical contact.

What is claimed is:

1. A photodevice comprising a semiconductor substrate of a first conductivity type containing a semiconductor layer of the same conductivity type formed on one surface thereof;

at least one region of opposite conductivity type formed in said semiconductor layer and extending to the top surface thereof;

an insulation layer overlying selected areas of said semiconductor layer, said insulation layer containing a selected fixed surface state charge $Q_{ss}$; wherein said insulation layer is an oxide of silicon and said fixed surface state charge density is in the range between 10 and $10^{13}$ per $cm.^2$ and a surface depletion layer in portions of said semiconductor layer, said depletion layer being located directly under, and within 1 micron of the interface between said insulation layer and said semiconductor layer, and contacting said at least one region.

metal contact layers attached to said underlying semiconductor substrate and to said at least one region of opposite conductivity, and means for reverse biasing the PN junction between said semiconductor layer, on the one hand, and said surface depletion layer and said at least one region on the other hand.

2. Structure as in claim 1 in which said substrate is P-type silicon, said epitaxial layer is P-type silicon, and said at least one region of opposite conductivity type comprises N-type silicon.

3. Structure as in claim 2 in which said insulation layer is an oxide of silicon and said fixed surface state charge density is at least $5\times10^{12}$ per $cm^2$.

4. Structure as in claim 2 including in said P-type epitaxial layer a guard ring diffused from the top surface, said guard ring containing said first type impurity to a concentration of at least $10^{17}$ atoms per $cm^3$.

5. Structure as in claim 4 including metal contacts attached to said guard ring.